US 6,738,237 B2

(12) United States Patent  
Gill (10) Patent No.: US 6,738,237 B2  
(45) Date of Patent: May 18, 2004

(54) AP-PINNED SPIN VALVE DESIGN USING VERY THIN PT-MN AFM LAYER

(75) Inventor: Hardayal Singh Gill, Portola Valley, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 502 days.

(21) Appl. No.: 09/754,952

(22) Filed: Jan. 4, 2001

(65) Prior Publication Data

US 2002/0085320 A1 Jul. 4, 2002

(51) Int. Cl.[7] .................................................. G11B 5/39
(52) U.S. Cl. .................................................. 360/324.11
(58) Field of Search ......................... 360/324.1, 324.21, 360/324.12, 324.2, 126

(56) References Cited

U.S. PATENT DOCUMENTS

| | | | |
|---|---|---|---|
| 5,206,590 A | 4/1993 | Dieny et al. ............... 324/252 |
| 5,549,978 A | 8/1996 | Iwasaki et al. ............ 428/692 |
| 5,688,605 A | 11/1997 | Iwasaki et al. ............ 428/611 |
| 5,698,335 A | 12/1997 | Iwasaki et al. ............ 428/611 |
| 5,702,832 A | 12/1997 | Iwasaki et al. ............ 428/611 |
| 5,725,963 A | 3/1998 | Iwasaki et al. ............ 428/611 |
| 5,738,946 A | 4/1998 | Iwasaki et al. ............ 428/611 |
| 5,828,529 A | 10/1998 | Gill ............................ 360/113 |
| 5,869,963 A | 2/1999 | Saito et al. ................ 324/252 |
| 5,959,810 A | 9/1999 | Kakihara et al. ........... 360/311 |
| 5,968,676 A | 10/1999 | Araki et al. ................ 428/692 |
| 6,034,845 A | 3/2000 | Nagasaka et al. .......... 360/113 |
| 6,222,707 B1 * | 4/2001 | Huai et al. ................. 360/324.1 |
| 6,322,911 B1 * | 11/2001 | Fukagawa et al. ......... 428/692 |
| 6,424,506 B1 * | 7/2002 | Saito et al. ................ 360/324.11 |
| 6,538,858 B1 * | 3/2003 | Hasegawa et al. ......... 360/324.12 |

* cited by examiner

Primary Examiner—David L. Ometz  
(74) Attorney, Agent, or Firm—Ronald B. Feece; William D. Gill (57) ABSTRACT

An antiparallel (AP)-pinned spin valve (SV) sensor is provided with an AFM layer of Pt—Mn having a thickness less than 100 Å and using the magnetic field of the sense current to assist the AFM layer in pinning the magnetization of the AP-pinned layer. The SV sensor has positive and negative read signal symmetry about a zero bias point of a transfer curve due to the influences of the a net sense current field, a ferromagnetic coupling field and a demagnetization field being counterbalanced by a net image field from asymmetric positioning of the SV sensor between first and second shield layers. The SV sensor includes an AP-pinned layer with first and second ferromagnetic pinned layers where the second pinned layer adjacent to a spacer layer is thicker than the first pinned layer. The direction of the sense current is chosen so that its magnetic field at the pinned layer is in the same direction as the magnetization of the thicker second pinned layer so as to assist in pinning of the AP-pinned layer to provide stable operation of the SV sensor.

21 Claims, 8 Drawing Sheets

AP-PINNED SPIN VALVE DESIGN USING VERY THIN PT-MN AFM LAYER

BACKGROUND OF THE INVENTION

1. Field of the Invention

This invention relates in general to spin valve magnetoresistive sensors for reading information signals from a magnetic medium and, in particular, to a spin valve sensor with stronger pinning and improved biasing for very thin Pt—Mn antiferromagnetic layers.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

Figure 1:
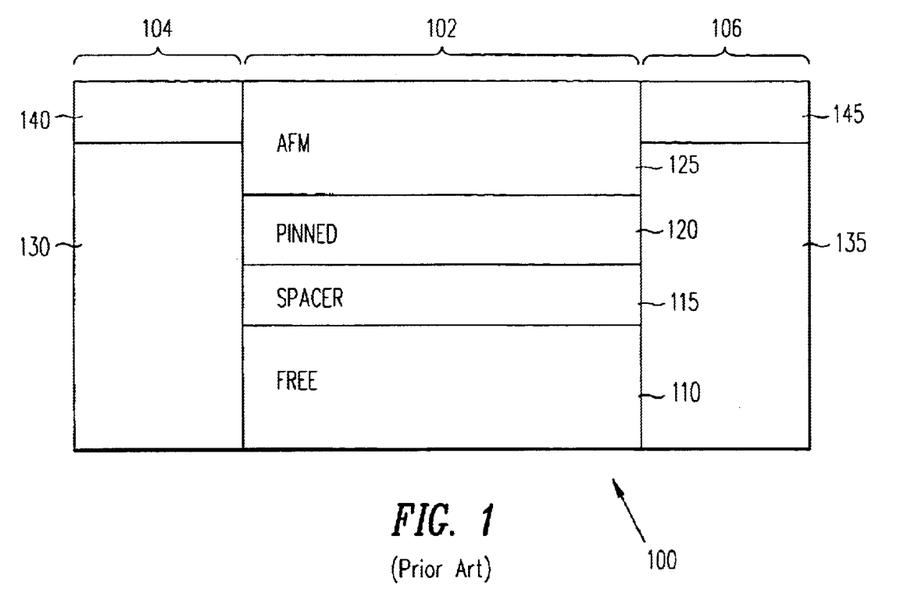
FIG. 1 is an air bearing surface view, not to scale, of a prior art SV sensor.

GMR sensors using only two layers of ferromagnetic material (e.g., Ni—Fe) separated by a layer of non-magnetic material (e.g., copper) are generally referred to as spin valve (SV) sensors manifesting the SV effect. FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Leads 140 and 145 formed in the end regions 104 and 106, respectively, provide electrical connections for sensing the resistance of SV sensor 100. IBM's U.S. Pat. No. 5,206,590 granted to Dieny et al., incorporated herein by reference, discloses a SV sensor operating on the basis of the GMR effect.

Another type of SV sensor is an antiparallel (AP)-pinned SV sensor. In AP-pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-pinned SV sensor provides improved exchange coupling of the antiferromagnetic (AFM) layer to the laminated pinned layer structure than is achieved with the pinned layer structure of the SV sensor of FIG. 1. This improved exchange coupling increases the stability of the AP-pinned SV sensor at high temperatures which allows the use of corrosion resistant and electrically insulating antiferromagnetic materials such as NiO for the AFM layer.

Figure 2:
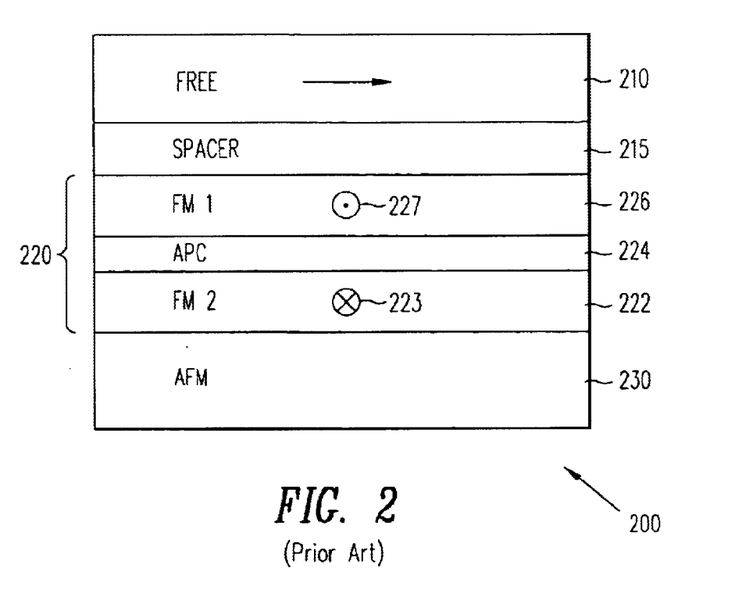
FIG. 2 is an air bearing surface view, not to scale, of a prior art AP-pinned SV sensor.

Referring to FIG. 2, an AP-pinned SV sensor 200 comprises a free layer 210 separated from a laminated AP-pinned layer structure 220 by a nonmagnetic, electrically-conducting spacer layer 215. The magnetization of the laminated AP-pinned layer structure 220 is fixed by an AFM layer 230. The laminated AP-pinned layer structure 220 comprises a first ferromagnetic layer 226 and a second ferromagnetic layer 222 separated by an antiparallel coupling (APC) layer 224 of nonmagnetic material (usually ruthenium (Ru)). The two ferromagnetic layers 226, 222 (FM1 and FM2) in the laminated AP-pinned layer structure 220 have their magnetization directions oriented antiparallel, as indicated by the arrows 227, 223 (arrows pointing out of and into the plane of the paper, respectively).

Figures 3A, 3B, 3C:
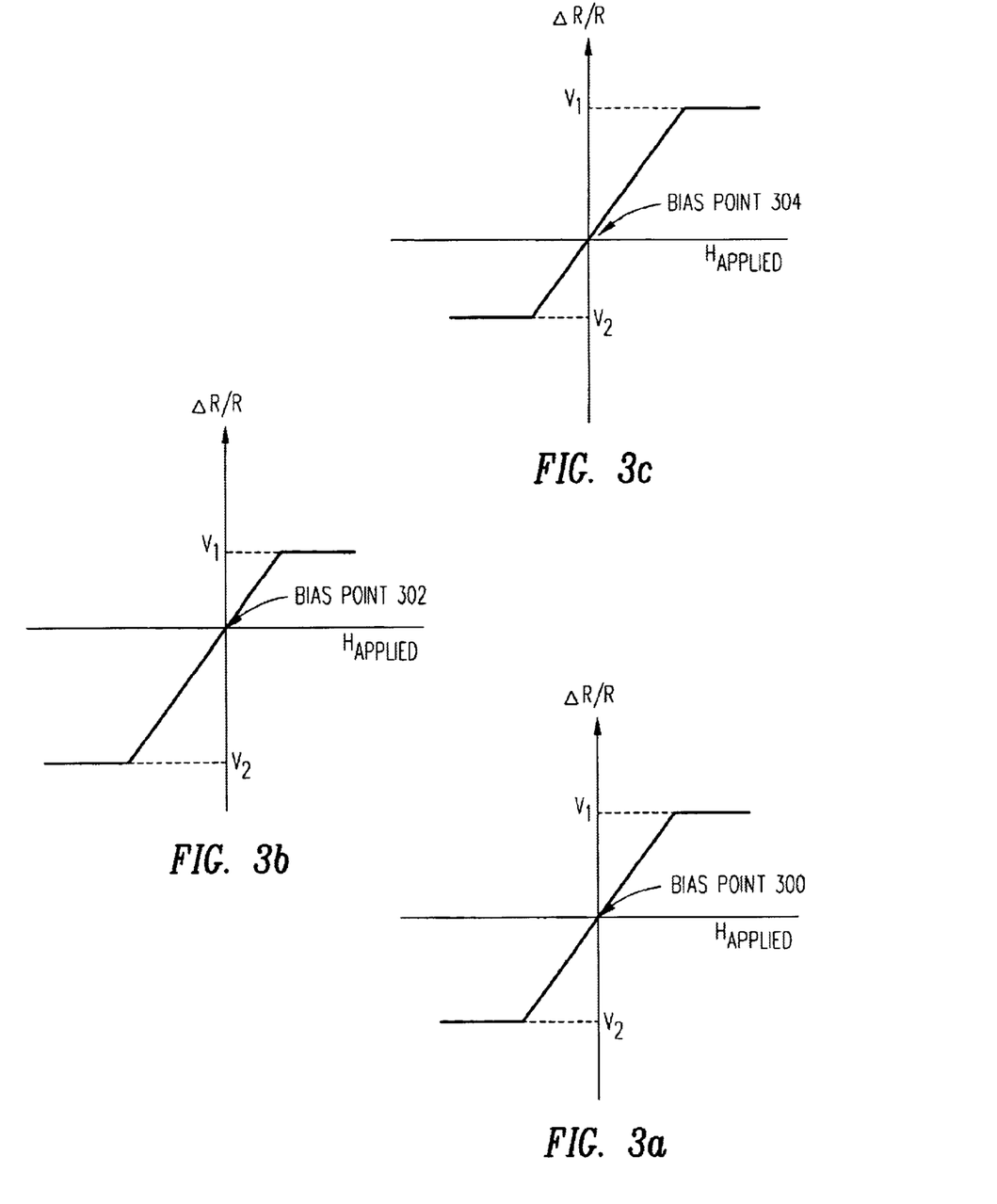
FIG. 3a is a transfer curve for a spin valve sensor having a bias point at the midpoint of the transfer curve so that positive and negative readback signals are symmetrical about a zero bias point.
FIG. 3b is a transfer curve for a spin valve sensor having a bias point shifted in the positive direction of the transfer curve so that positive and negative readback signals are asymmetrical about the bias point.
FIG. 3c is a transfer curve for a spin valve sensor having a bias point shifted in the negative direction of the transfer curve so that positive and negative readback signals are asymmetrical about the bias point.

The transfer curve (readback signal of the spin valve head versus applied signal from the magnetic disk) for a spin valve is linear and is defined by $\sin \theta$ where $\theta$ is the angle between the directions of the magnetizations of the free and pinned layers. FIG. 3a is an exemplary transfer curve for a spin valve sensor having a bias point (operating point) 300 at the midpoint of the transfer curve, at which point the positive and negative readback signals $V_1$ and $V_2$ (positive and negative changes in the GMR of the spin valve above and below the bias point) are equal (symmetrical) when sensing positive and negative fields having the same magnitude from the magnetic disk. FIGS. 3b and 3c illustrate transfer curves having bias points 302 and 304 shifted in the positive and negative directions, respectively, so that the readback signals $V_1$ and $V_2$ are asymmetrical with respect to the bias point.

The desirable symmetric bias transfer curve of FIG. 3a is obtained when the SV sensor is in its quiescent state (no magnetic signal from the disk) and the direction of the magnetization of the free layer is perpendicular to the magnetization of the pinned layer which is fixed substantially perpendicular to the disk surface. The bias point may be shifted from the midpoint of the transfer curve by various influences on the free layer which in the quiescent state can act to rotate its magnetization relative to the magnetization of the pinned layer.

The bias point is influenced by four major forces on the free layer, namely a ferromagnetic coupling field $H_{FC}$ between the pinned layer and the free layer, a demagnetization field $H_{demag}$ on the free layer from the pinned layer, a sense current field $H_{SC}$ from all conductive layers of the spin valve except the free layer, and the AMR effect from the free layer which is also present in a spin valve sensor. The influence of the AMR on the bias point is the same as a magnetic influence thereon and can be defined in terms of magnitude and direction referred to herein as the AMR EFFECT. IBM's U.S. Pat. No. 5,828,529 to Gill, incorporated herein by reference, discloses an AP-pinned spin valve with bias point symmetry obtained by counterbalancing the combined influence of $H_{FC}$, $H_{demag}$ and $H_{SC}$ by the influence of the AMR EFFECT on the free layer.

A problem with the prior art sensors arises as the size of spin valve sensors is decreased in order to address the need for higher storage density disk files. To minimize the thickness of the spin valve sensor, a thin AFM layer of Pt—Mn is desirable.

However, for very thin Pt—Mn, exchange coupling between the AFM layer and the ferromagnetic pinned layer is reduced to near zero resulting in very weak pinning and poor stability of the spin valve sensor. In addition, the AMR effect in the thinner free layer decreases and therefore the AMR EFFECT is no longer sufficient to counterbalance the influences of $H_{FC}$, $H_{demag}$ and $H_{SC}$ resulting in a shift of the bias point toward a positive asymmetry. The asymmetric bias results in asymmetric readback signal response for positive and negative magnetic signals and to reduced signal output and dynamic range of the SV sensor.

Therefore there is a need for a spin valve sensor design using a thin AFM layer of Pt—Mn that provides increased pinning field and a symmetric bias point on the transfer curve for improved signal stability and output without sacrificing other desirable characteristics.

SUMMARY OF THE INVENTION

Accordingly, it is an object of the present invention to disclose a spin valve sensor with a thin AFM layer of Pt—Mn having increased pinning field strength and zero signal asymmetry.

It is another object of the present invention to disclose a spin valve sensor having the direction of the sense current chosen so that its field increases the pinning field at the pinned layer.

It is a further object of the present invention to disclose a spin valve sensor positioned asymmetrically between first and second shield layers to provide an image field to obtain zero signal asymmetry.

It is a yet another object of the present invention to disclose a spin valve sensor having the magnetization of the pinned layer canted to obtain zero signal asymmetry.

In accordance with the principles of the present invention, there is disclosed a preferred embodiment of the present invention wherein a spin valve sensor has a thin antiferromagnetic (AFM) layer of Pt—Mn and an antiparallel (AP)-pinned layer with first and second ferromagnetic layers of different thickness antiparallel coupled by an antiparallel coupling (APC) layer. The first ferromagnetic layer is adjacent to the AFM layer and the thicker second ferromagnetic layer is adjacent to an electrically conductive spacer layer. A ferromagnetic free layer is adjacent to the spacer layer. The direction of flow of the sense current in the SV sensor is chosen so that its induced magnetic field adds to the magnetization of the thicker second ferromagnetic layer of the AP-pinned layer exchange coupled to the AFM layer. The magnetization of the second ferromagnetic layer due to the additive effects of the exchange coupling to the AFM layer and the sense current induced magnetic field provides a sufficiently strong total pinning field for the SV sensor.

Since the field from the sense current assists pinning, a narrow, high amplitude pulse of current may be used to set the magnetization of the pinned layer. Following the usual free layer/hard bias initialization procedure, a narrow, high current (100 nsec, 8 mA) pulse provides a field of about 250 Oe which is well above the coercivity of the pinned layer and therefore sufficient to set the magnetization direction of the pinned layer.

The forces on the free layer that influence the bias point on the sensor transfer curve are oriented so that the combined effects of the sense current field $H_{SC}$, the demagnetization field $H_{demag}$ and the negative ferromagnetic coupling field $H_{FC}$ are opposed by the net image field $H_{image}$ due to images of the sense current in the first and second shields. With the center of the free layer positioned a greater distance from the surface of the first shield than the distance from the surface of the second shield, $H_{image}$ opposes $H_{SC}$, $H_{demag}$ and $H_{FC}$ to counterbalance their combined effect. However, when $H_{image}$ is not sufficient to totally counterbalance their combined effect, signal asymmetry of the SV sensor may be reduced to near zero by canting the direction of magnetization of the pinned layer to compensate for the residual bias field acting on the free layer. Canting of the magnetization of the pinned layer is achieved by applying a field component in the plane of the AFM layer and perpendicular to the field of the current pulse used to set the pinned layer magnetization.

The above as well as additional objects, features, and advantages of the present invention will become apparent in the following detailed description.

BRIEF DESCRIPTION OF THE DRAWINGS

For a fuller understanding of the nature and advantages of the present invention, as well as of the preferred mode of use, reference should be made to the following detailed description read in conjunction with the accompanying drawings. In the following drawings, like reference numerals desigate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 4:
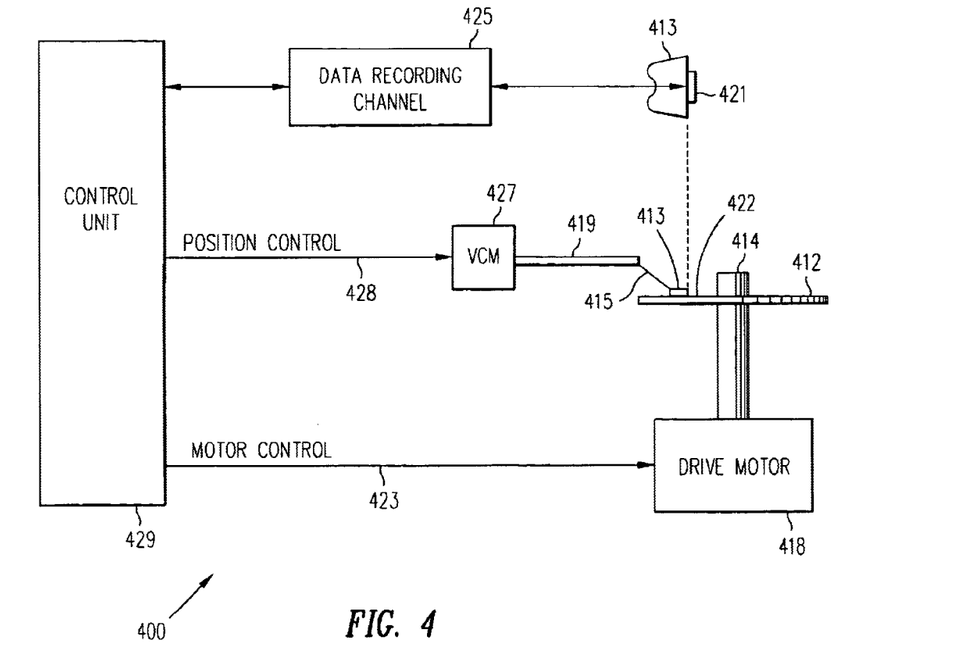
FIG. 4 is a block diagram of a magnetic recording disk drive system.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording media on each disk is in the form of an annular pattern of concentric data tracks (not shown) on the disk 412.

At least one slider 413 is positioned on the disk 412, each slider 413 supporting one or more magnetic read/write heads 421 where the head 421 incorporates the SV sensor of the present invention. As the disks rotate, the slider 413 is moved radially in and out over the disk surface 422 so that the heads 421 may access different portions of the disk where desired data is recorded. Each slider 413 is attached to an actuator arm 419 by means of a suspension 415. The suspension 415 provides a slight spring force which biases the slider 413 against the disk surface 422. Each actuator arm 419 is attached to an actuator 427. The actuator as shown in FIG. 4 may be a voice coil motor (VCM). The VCM comprises a coil movable within a fixed magnetic field, the direction and speed of the coil movements being controlled by the motor current signals supplied by a controller 429.

During operation of the disk storage system, the rotation of the disk 412 generates an air bearing between the slider 413 (the surface of the slider 413 which includes the head 421 and faces the surface of the disk 412 is referred to as an air bearing surface (ABS)) and the disk surface 422 which exerts an upward force or lift on the slider. The air bearing thus counterbalances the slight spring force of the suspension 415 and supports the slider 413 off and slightly above the disk surface by a small, substantially constant spacing during normal operation.

The various components of the disk storage system are controlled in operation by control signals generated by the control unit 429, such as access control signals and internal clock signals. Typically, the control unit 429 comprises logic control circuits, storage chips and a microprocessor. The control unit 429 generates control signals to control various system operations such as drive motor control signals on line 423 and head position and seek control signals on line 428. The control signals on line 428 provide the desired current profiles to optimally move and position the slider 413 to the desired data track on the disk 412. Read and write signals are communicated to and from the read/write heads 421 by means of the data recording channel 425. Recording channel 425 may be a partial response maximum likelihood (PMRL) channel or a peak detect channel. The design and implementation of both channels are well known in the art and to persons skilled in the art. In the preferred embodiment, recording channel 425 is a PMRL channel.

The above description of a typical magnetic disk storage system, and the accompanying illustration of FIG. 4 are for representation purposes only. It should be apparent that disk storage systems may contain a large number of disks and actuator arms, and each actuator arm may support a number of sliders.

Figure 5:
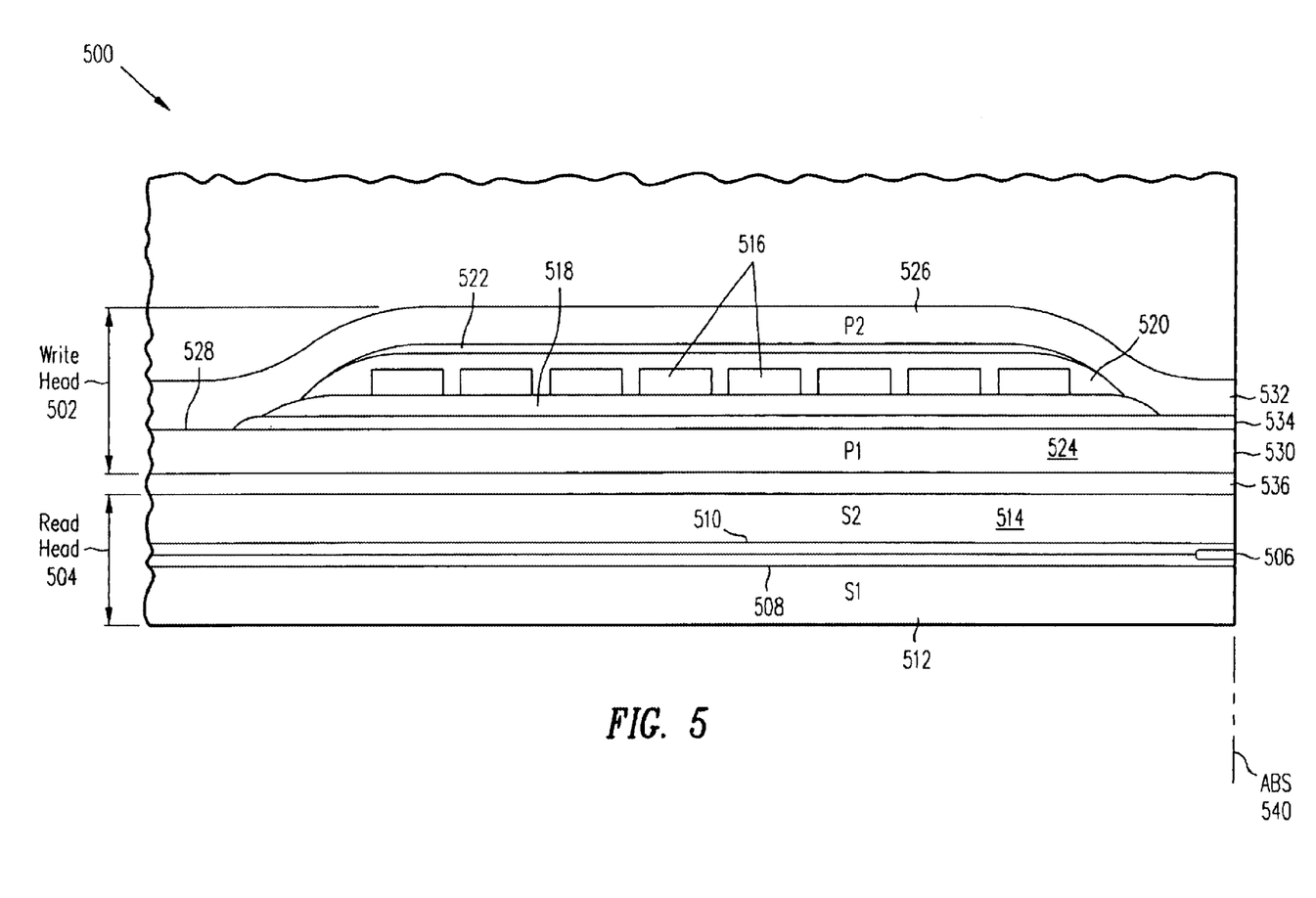
FIG. 5 is a vertical cross-section view (not to scale) of a "piggyback" read/write magnetic head.

FIG. 5 is a side cross-sectional elevation view of a "piggyback" magnetic read/write head 500, which includes a write head portion 502 and a read head portion 504, the read head portion employing a spin valve sensor 506 according to the present invention. The spin valve sensor 506 is sandwiched between nonmagnetic insulative first and second read gap layers 508 and 510, and the read gap layers are sandwiched between ferromagnetic first and second shield layers 512 and 514. In response to external magnetic fields, the resistance of the spin valve sensor 506 changes. A sense current Is conducted through the sensor causes these resistance changes to be manifested as potential changes. These potential changes are then processed as readback signals by the processing circuitry of the data recording channel 425 shown in FIG. 4.

The write head portion 502 of the magnetic read/write head 500 includes a coil layer 516 sandwiched between first and second insulation layers 518 and 520. A third insulation layer 522 may be employed for planarizing the head to eliminate ripples in the second insulation layer 520 caused by the coil layer 516. The first, second and third insulation layers are referred to in the art as an insulation stack. The coil layer 516 and the first, second and third insulation layers 518, 520 and 522 are sandwiched between first and second pole piece layers 524 and 526. The first and second pole piece layers 524 and 526 are magnetically coupled at a back gap 528 and have first and second pole tips 530 and 532 which are separated by a write gap layer 534 at the ABS 540. An insulation layer 536 is located between the second shield layer 514 and the first pole piece layer 524. Since the second shield layer 514 and the first pole piece layer 524 are separate layers this read/write head is known as a "piggyback" head.

Figure 6:
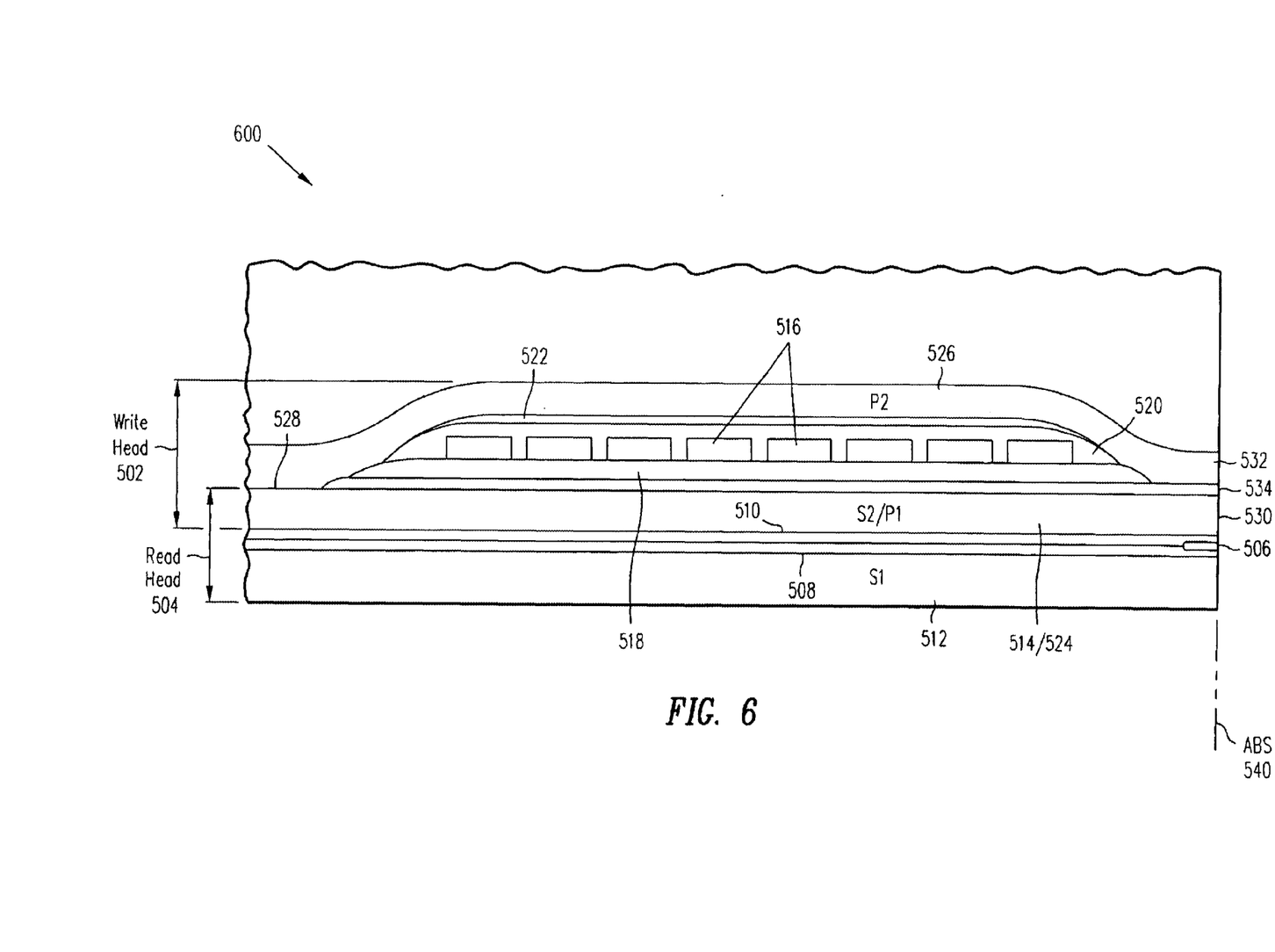
FIG. 6 is a vertical cross-section view (not to scale) of a "merged" read/write magnetic head.

FIG. 6 is the same as FIG. 5 except the second shield layer 514 and the first pole piece layer 524 are a common layer. This type of read/write head is known as a "merged" head 600. The insulation layer 536 of the piggyback head in FIG. 5 is omitted in the merged head 600 of FIG. 6.

Figure 7:
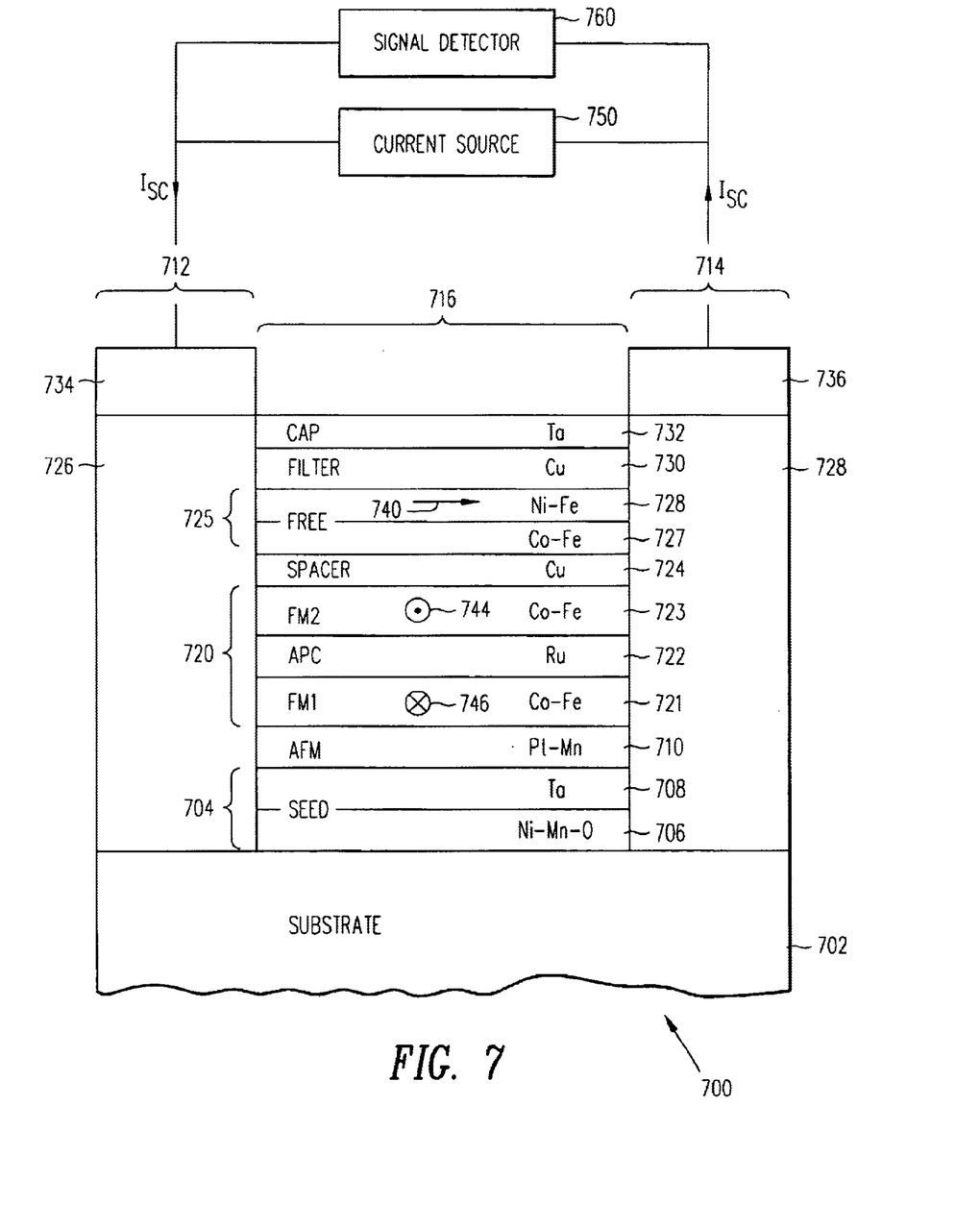
FIG. 7 is an air bearing surface view (not to scale) of the improved spin valve sensor of the present invention.

FIG. 7 shows an air bearing surface (ABS) view of an antiparallel (AP)-pinned spin valve (SV) sensor 700 according to the preferred embodiment of the present invention. The SV sensor 700 comprises end regions 712 and 714 separated from each other by a central region 716. The substrate 702 can be any suitable substance, including glass, semiconductor material, or a ceramic material, such as alumina ($Al_2O_3$). The seed layer 704 is a bilayer deposited in the central region 716 to modify the crystallographic texture or grain size of the subsequent layers.

A first sublayer 706 of Ni—Mn—O is deposited over the substrate 702 and a second sublayer 708 of tantalum (Ta) is deposited over the first sublayer 706. An antiferromagnetic (AFM) layer 710 of Pt—Mn having a thickness in the range of 50–100 Å is deposited over the seed layer 704. A laminated AP-pinned layer 720 is formed on the AFM Layer 710. A ferromagnetic free layer 725 is separated from the pinned layer 720 by a nonmagnetic, electrically conducting spacer layer 724. The free layer 725 comprises a first free sublayer 727 preferably formed of Co—Fe adjacent to the spacer layer 724 and a second free sublayer 728 of Ni—Fe formed over the first free sub layer 727. The magnetization of the free layer 725 is preferably parallel to the ABS in the absence of an external field as indicated by the arrow 740. A spin-filter layer 730 of nonmagnetic, electrically conducting material, preferably copper (Cu) is formed over the the free layer 725. A cap layer 732 formed on the spin-filter layer 730 completes the central region 716 of the SV sensor 700. In the present embodiment, the cap layer 732 is formed of tantalum (Ta).

As can be seen in the view of FIG. 7, the AP-pinned layer 720 comprises a first ferromagnetic pinned layer (FM1) 721 and a thicker second ferromagnetic pinned layer (FM2) 723 separated by an antiparallel coupling (APC) layer 722. The APC layer 722 is formed of a nonmagnetic material, preferably ruthenium (Ru), that allows the the FM1 layers 721 and 723 to be strongly coupled together antiferromagnetically.

The SV sensor 700 further comprises layers 726 and 728 formed on the end regions 712 and 714, respectively, for providing a longitudinal bias field to the free layer 726 to ensure a single magnetic domain state in the free layer. Lead layers 734 and 736 are also deposited on the end regions 712 and 714, respectively, to provide electrical connections for the flow of a sensing current $I_{SC}$ from a current source 750 to the SV sensor 700. A signal detector 760 which is electrically connected to leads 734 and 736 senses the change in resistance due to changes induced in the free layer 725 by the external magnetic field (e.g., field generated by a data bit stored on a disk). The external magnetic field acts to rotate the direction of magnetization of the free layer 725 relative to the direction of magnetization of the pinned layer 720 which is preferably pinned perpendicular to the ABS. The signal detector 760 preferably comprises a partial response maximum likelihood (PRML) recording channel for processing the signal detected by SV sensor 700. Alternatively, a peak detect channel or a maximum likelihood channel (e.g., 1,7 ML) may be used. The design and implementation of the aforementioned channels are known to those skilled in the art. The signal detector 760 also includes other supporting circuitries such as a preamplifier (electrically placed between the sensor and the channel) for conditioning the sensed resistance changes as is known to those skilled in the art.

The SV sensor 700 is fabricated in a magnetron sputtering or ion beam sputtering system to sequentially deposit the multilayer structure shown in FIG. 7. The sputter deposition process is carried out in the presence of a transverse magnetic field of about 40 Oe. The first sublayer 706 of Ni—Mn—O having a thickness of about 30 Å is deposited on an $Al_2O_3$ substrate 702. The second sublayer 708 of Ta having a thickness in the range of 30–50 Å is deposited over the first sublayer 706. The AFM layer 710 formed of Pt—Mn having a thickness in the range of 50–100 Å is deposited over the second sublayer 708 of the seed layer 704.

The FM1 layer 721 is formed of Co—Fe having a thickness in the range of 5–30 Å deposited on the AFM layer 710. The APC layer 722 is formed of Ru having a thickness of about 6 Å deposited on the FM1 layer 721. The FM2 layer 723 is formed of Co—Fe having a thickness in the range of 10–50 Å deposited on the APC layer 722. The thickness of the FM2 layer 723 is chosen to be greater than the thickness of the FM1 layer 721 so that the net magnetization of the pinned layer 720, determined as the difference of the magnetizations 744 and 746 of the AP-coupled FM2 and FM1 layers 723 and 721, respectively, is in the direction of the magnetization 744 of the FM2 layer 723.

The nonmagnetic conductive spacer layer 724 is formed of copper (Cu) having a thickness of about 20 Å deposited on the FM2 layer 723. The free layer 725 is formed of a first free sublayer 727 of Co—Fe having a thickness in the range of 5–20 Å deposited on the spacer layer and a second free sublayer 728 of Ni—Fe (permalloy) having a thickness in the range of 20–50 Å deposited on the first free sublayer 727. The spin-filter layer 730 of Cu having a thickness in the range of 5–20 Å is deposited on the second free sublayer 728. The cap layer 732 of Ta having a thickness in the range of 20–50 Å is deposited over the filter layer 730.

Following the usual free layer/hard bias initialization procedure well known to the art, the sense current $I_{SC}$ is pulsed using a very short (about 100 nsec), high amplitude (about 8 mA) current pulse through the SV sensor 700 to set the magnetization of the pinned layer. For an SV sensor having an 0.2 μm stripe height, the 8 mA current pulse provides a field of about 250 Oe at the AP-pinned layer 720 which is well above the coercivity $H_C$ of the pinned layer and therefore sets the pinned layer magnetization in a direction transverse to the ABS.

For the AFM layer 710 formed of Pt—Mn having a thickness less than 100 Å, exchange coupling between the AFM layer 710 and the FM1 layer 721 is near zero. However, the Pt—Mn AFM layer 710 raises the coercivity of the AP-pinned layer 720 to about 100 Oe. The polarity of the sense current $I_{SC}$ is chosen so that its magnetic field assists magnetization 744 of the thicker FM2 layer 723 and therefore assists pinning of the AP-pinned layer by the AFM layer. For example, a sense current $I_{SC}$ having a magnitude of 4 mA provides a field of about 125 Oe which adds to the 100 Oe coercivity increase provided by the AFM layer resulting in a total pinning field of 225 Oe at the AP-pinned layer 720. Since, for an AP-pinned type SV sensor pinned layer demagnetization is small, a total pinning field of this magnitude is sufficient to provide stable operation of the SV sensor.

Figure 8:
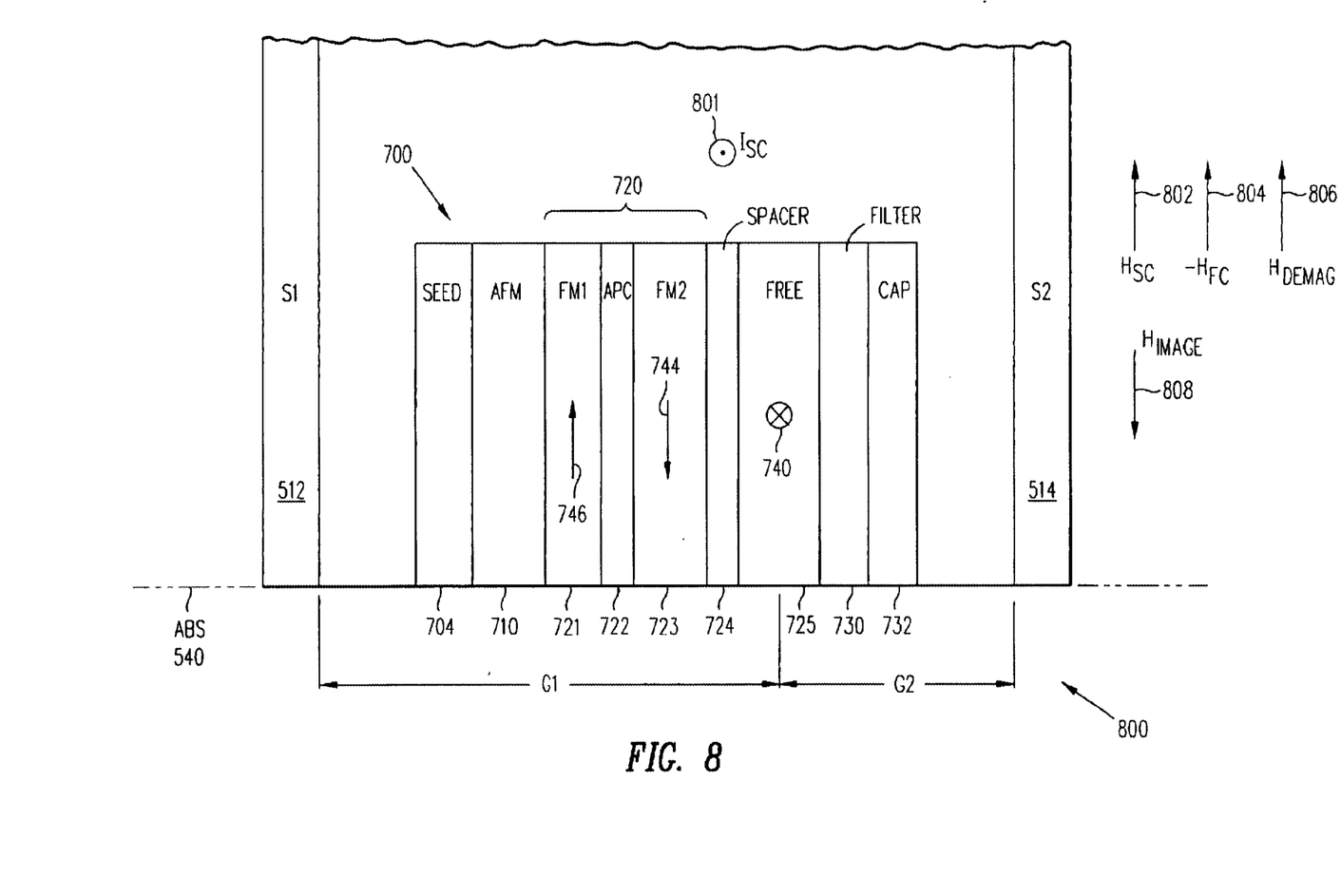
FIG. 8 is a side cross-section view (not to scale) of a read head with the spin valve sensor of the present invention.

FIG. 8 is a side cross-sectional view perpendicular to the ABS 540 of a read head 800 using the SV sensor 700 of the present invention. The thicknesses of the FM1 and FM2 layers 721 and 723 determine the net magnetization of the AP-pinned layer 720 and are chosen so that the net magnetization of the AP-pinned layer 720 is approximately equivalent to 5–10 Å of Ni—Fe directed perpendicular to and toward the ABS 540. The small magnitude of the net magnetization promotes strong antiferromagnetic coupling of the pinned layer 720 to the AFM layer 710. The direction of the flow of the sense current $I_{SC}$, indicated by the head of an arrow 801 pointing out of the plane of the paper, is chosen so that its magnetic field at the FM2 layer 723 is in the same direction as the direction of the magnetization 744 of the FM2 layer and therefore assists the pinning of the AP-pinned layer 720 by the AFM layer 710.

Various influences on the free layer 725 and consequently various influences on the bias point of the transfer curve for the SV sensor 700 are shown in FIG. 8. The influences on the magnetization 740 of the free layer 725 are $H_{demag}$ 806, HFC 804, $H_{image}$ 808 and $H_{SC}$ 802. $H_{demag}$ 806 is due to the net magnetization of the AP-pinned layer 720, $H_{FC}$ 804 is negative due to an antiferromagnetic coupling between the free layer 725 and the FM2 layer 723, $H_{image}$ is a net image field from the first and second shields 512 and 514 due to the sense current flowing in the SV sensor, and $H_{SC}$ 802 is the net sense current field on the free layer due to conduction of the sense current through all the layers conductive layers of the SV sensor 700. The presence of the spin-filter layer 730 of Cu reduces the magnitude of the net sense current field $H_{SC}$ since the field from current flowing in the spin-filter layer 730 opposes the field from current flowing through layers on the opposite side of the free layer 725.

FIG. 8 shows the SV sensor 700 located asymmetrically within the gap between the first shield 512 and the second shield 514. The SV sensor is positioned so that the center of the free layer 725 is a distance G1 from the nearest surface of the first shield 512 and a distance G2 from the nearest surface of the second shield 514. When G1=G2, the image field from the first shield 512 due to current flowing in the SV sensor is cancelled by the image field from the second shield 514 due to the same current flowing in the SV sensor. However, when G1 is significantly larger than G2, a net image field $H_{image}$ 808 directed perpendicular to and toward the ABS 540 is present at the free layer 725.

Because, for SV sensor 700, $H_{FC}$ is negative due to the antiferromagnetic coupling between the free layer 725 and the FM2 layer 723, the influences on the free layer 725 of $H_{SC}$ 802, $H_{FC}$ 804 and $H_{demag}$ 806 are in the same direction. In order to achieve a proper bias of the SV sensor at the midpoint of the transfer curve (as indicated by the bias point 300 in FIG. 3a), the influence of $H_{image}$ 808 must act to counterbalance the combined influences of $H_{SC}$ 802, $H_{FC}$ 804 and $H_{demag}$ 806. In order for the influence of $H_{image}$ to exactly or nearly exactly counterbalance the influences of $H_{SC}$, $H_{FC}$ and $H_{demag}$, the distance G1 must be significantly larger than the distance G2, preferably G1 is about 1.5 times larger than G2.

Figure 9:
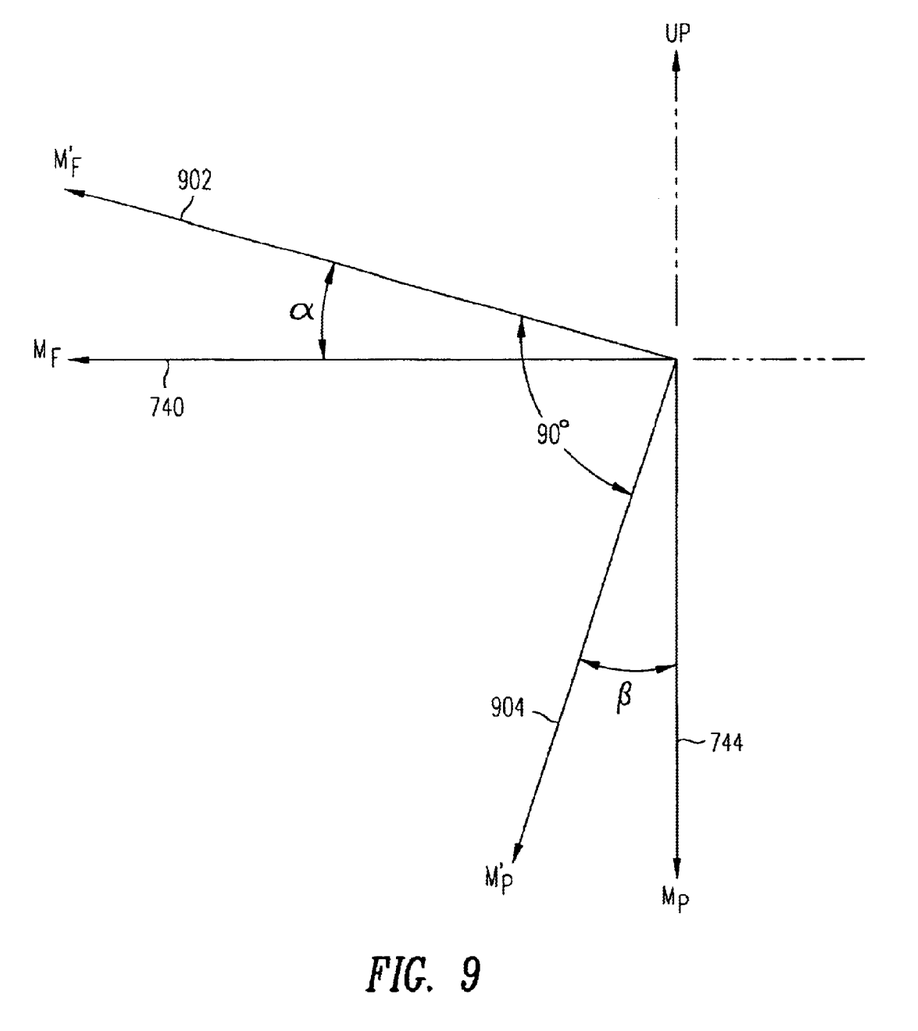
FIG. 9 is a view perpendicular to the SV sensor layers viewed from the first shield (S1) of the relative orientation of the magnetizations of the free and FM2 layers.

FIG. 9 shows an alternate process for obtaining proper bias of the SV sensor 700 which can be used when the influence of the image field $H_{image}$ is not sufficient to counterbalance the combined influences of the sense current field $H_{SC}$, the ferromagnetic coupling field $H_{FC}$ and the demagnetization field $H_{demag}$ to obtain symmetric response to positive and negative readback signals. FIG. 9 is a view perpendicular to the layers of SV sensor 700 viewed from the first shield S1 512 of the relative orientation of the magnetization ($M_F$) 740 of the free layer 725 and the magnetization ($M_P$) 744 of the FM2 layer 723 under conditions where the influences of $H_{SC}$, $H_{FC}$ and $H_{demag}$ are exactly counterbalanced by the influence of $H_{image}$ on the free layer 725. In this desirable zero bias condition, the magnetization $M_F$ 740 of the free layer 725 is perpendicular to the magnetization $M_P$ 744 of the FM2 layer 723. However, when the magnitude of the image field $H_{image}$ is not sufficient to counterbalance the combined effects of $H_{SC}$, $H_{FC}$ and $H_{demag}$, a net upward directed field is present at the free layer 725 resulting in a rotation of its magnetization $M_F$ 740 through an angle a to a new direction of magnetization $M_F'$ 902. The magnetization $M_F'$ 902 is directed at an angle (90+α)° relative to the magnetization $M_P$ 744. In this bias condition, the transfer curve for the SV sensor 700 has its bias point shifted in the positive direction as indicated in FIG. 3b so that positive and negative readback signals are asymmetric about the bias point 302. In order to compensate for this condition and return to the symmetric zero bias condition of the transfer curve shown in FIG. 3a, a process step of canting the magnetization of the AP-pinned layer 720 may be applied. During the setting of the pinned layer, a longitudinal magnetic field opposite to the direction of magnetization 740 of the free layer 725 is applied providing a field component that results in canting of the pinned layer magnetization. Because of the antiparallel coupling of the AP-pinned layers, the canting of the magnetization of the pinned layer rotates the magnetization $M_P$ 744 of the FM2 layer 723 through an angle β to a new direction of magnetization $M_P'$ 904. The magnitude of the longitudinal magnetic field applied during the setting of the pinned layer is chosen so that the angle of rotation β of the magnetization of the FM2 layer 723 equals, or nearly equals, the angle of rotation α of the magnetization of the free layer 725 due to the net biasing effects of fields $H_{SC}$, $H_{FC}$, $H_{demag}$ and $H_{image}$. When angle a is equal to angle β, the direction of magnetization $M_F'$ of the free layer 725 is again perpendicular to the direction of magnetization $M_P'$ of the FM2 layer 723 providing the desired symmetric bias point on the transfer curve.

With reference to FIGS. 7, 8 and 9, it will be apparent to those skilled in the art that the SV sensor 700 may alternatively have the pinned layer 720 set so that the magnetization 744 of the FM2 layer 723 is directed perpendicular to and away from the ABS 540. In this case, the polarity of the flow of the sense current 801 is chosen to be directed into the plane of the paper in FIG. 8 resulting in the directions of the fields $H_{SC}$, $H_{FC}$, $H_{demag}$ and $H_{image}$ all being opposite to the directions shown in FIG. 8.

An advantage of the SV sensor 700 of the present invention is that the direction of flow of the sense current causes a net sense current field which is imposed on and increases the strength of the magnetic pinning of the AP-pinned layer 720. This additional pinning effect allows the use of a thin AFM layer of Pt—Mn in spite of the weak exchange coupling between the AFM layer 710 and the FM1 layer 721. The use of a thin AFM layer of Pt—Mn is desirable because of the high reliability of the Pt—Mn material and because improved magnetoresistivity and thinner read gaps for improved storage density can be achieved.

While the present invention has been particularly shown and described with reference to the preferred embodiments, it will be understood to those skilled in the art that various changes in form and detail may be made without departing from the spirit, scope and teaching of the invention. Accordingly, the disclosed invention is to be considered merely as illustrative and limited only as specified in the appended claims.

I claim:

1. A spin valve (SV) magnetoresistive sensor which has positive and negative readback signals about a bias point of a transfer curve upon sensing positive and negative magnetic incursions from a moving magnetic medium, said SV sensor comprising:

a ferromagnetic free layer having a magnetization that is free to rotate in first and second directions from a position which corresponds to said bias point upon sensing positive and negative magnetic incursions, respectively;

an antiparallel (AP)-pinned layer having a magnetization that is pinned in a pinned direction, said AP-pinned layer including:
 a first ferromagnetic (FM1) pinned layer;
 a second ferromagnetic (FM2) pinned layer having a thickness greater than said FM1 layer; and
 an antiparallel coupling (APC) layer disposed between the FM1 layer and the FM2 layer;

an antiferromagnetic (AFM) layer immediately adjacent said FM1 layer which pins the magnetization of the AP-pinned layer along said pinned direction;

a nonmagnetic electrically conductive spacer layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the SV sensor to a sense current;

a nonmagnetic electrically conductive spin-filter layer adjacent to the free layer;

a current source connected to the SV sensor for applying said sense current, said sense current having a direction of flow that upon applying said sense current a net sense current field ($H_{SC}$) due to fields from electrically conductive layers of the SV sensor has a direction and magnitude that assists the AFM layer in pinning the AP-pinned layer in said pinned direction;

the direction of the magnetization of the free layer being influenced by a ferromagnetic coupling field ($H_{FC}$)

from the FM2 layer, a demagnetization field ($H_{demag}$) from the AP-pinned layer, a net image field ($H_{image}$) and the net sense current field ($H_{SC}$); and said sense current having a predetermined direction and of such magnitude and direction that a net influence of $H_{FC}$, $H_{demag}$, $H_{image}$ and $H_{SC}$ on the free layer is substantially zero.

2. The SV sensor as recited in claim 1, wherein the AFM layer is made of Pt—Mn.

3. The SV sensor as recited in claim 2, wherein the AFM layer has a thickness in the range of 50–100 Å.

4. The SV sensor as recited in claim 1, wherein in the absence of positive and negative magnetic incursions the magnetization of said AP-pinned layer is pinned in a direction substantially perpendicular to the direction of magnetization of said free layer.

5. A spin valve (SV) magnetoresistive sensor which has positive and negative readback signals about a bias point of a transfer curve upon sensing positive and negative magnetic incursions from a moving magnetic medium, said SV sensor comprising:

a ferromagnetic free layer having a magnetization that is free to rotate in first and second directions from a position which corresponds to said bias point upon sensing positive and negative magnetic incursions, respectively;

an antiparallel (AP)-pinned layer having a magnetization that is pinned in a pinned direction, said AP-pinned layer including:
a first ferromagnetic (FM1) pinned layer;
a second ferromagnetic (FM2) pinned layer having a thickness greater than said FM1 layer; and
an antiparallel coupling (APC) layer disposed between the FM1 layer and the FM2 layer;

an antiferromagnetic (AFM) layer immediately adjacent said FM1 layer which pins the magnetization of the AP-pinned layer along said pinned direction;

a nonmagnetic electrically conductive spacer layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the SV sensor to a sense current;

a nonmagnetic electrically conductive spin-filter layer adjacent to the free layer;

a current source connected to the SV sensor for applying said sense current, said sense current having a direction of flow that upon applying said sense current, a net sense current field ($H_{SC}$) due to fields from electrically conductive layers of the SV sensor has a direction and magnitude that assists the AEM layer in pinning the AP-pinned layer in said pinned direction;

the direction of the magnetization of the free layer being influenced by a ferromagnetic coupling field ($H_{FC}$) from the FM2 layer, a demagnetization field ($H_{demag}$) from the AP-pinned layer, a net image field ($H_{image}$) and the net sense current field ($H_{SC}$); and the direction of magnetization of the AP-pinned layer being pinned in a canted direction of such magnitude and direction that the net influence of $H_{FC}$, $H_{demag}$, $H_{image}$ and $H_{SC}$ on the free layer rotates the direction of magnetization of the free layer to a direction substantially perpendicular to the canted direction of magnetization of the AP-pinned layer.

6. The SV sensor as recited in claim 5, wherein the AFM layer is made of Pt—Mn.

7. The SV sensor as recited in claim 6, wherein the AFM layer has a thickness in the range of 50–100 Å.

8. A magnetic read/write head comprising:
a write head including:
at least one coil layer and an insulation stack, the coil layer being embedded in the insulation stack;
first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;
a read head including:
a spin valve (SV) sensor, first and second gap layers, and first and second shield layers, the SV sensor being sandwiched between the first and second gap layers and the first and second gap layers being sandwiched between the first and second shield layers;
the SV sensor having positive and negative readback signals about a bias point of a transfer curve upon sensing positive and negative magnetic incursions from a moving magnetic medium, said SV sensor comprising:
a ferromagnetic free layer having a magnetization that is free to rotate in first and second directions from a position which corresponds to said bias point upon sensing positive and negative magnetic incursions, respectively;
an antiparallel (AP)-pinned layer having a magnetization that is pinned in a pinned direction, said AP-pinned layer including:
a first ferromagnetic (FM1) pinned layer;
a second ferromagnetic (FM2) pinned layer having a thickness greater than said FM1 layer; and
an antiparallel coupling (APC) layer disposed between the FM1 layer and the FM2 layer;
an antiferromagnetic (AFM) layer immediately adjacent said FM1 layer which pins the magnetization of the AP-pinned layer along said pinned direction;
a nonmagnetic electrically conductive spacer layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the SV sensor to a sense current;
a nonmagnetic electrically conductive spin-filter layer adjacent to the free layer;
a current source connected to the SV sensor for applying said sense current, said sense current having a direction of flow that upon applying said sense current a net sense current field ($H_{SC}$) due to fields from electrically conductive layers of the SV sensor has a direction and magnitude that assists the AFM layer in pinning the AP-pinned layer in said pinned direction;
the direction of the magnetization of the free layer being influenced by a ferromagnetic coupling field ($H_{FC}$) from the FM2 layer, a demagnetization field ($H_{demag}$) from the AP-pinned layer, a net image field ($H_{image}$) and the net sense current field ($H_{SC}$); and said sense current having a predetermined direction and of such magnitude and direction that a net influence of $H_{FC}$, $H_{demag}$, $H_{image}$ and $H_{SC}$ on the free layer is substantially zero; and an insulation layer disposed between the second shield layer of the read head and the first pole piece layer of the write head.

9. The magnetic read/write head as recited in claim 8, wherein the AFM layer is made of Pt—Mn.

10. The magnetic read/write head as recited in claim 9, wherein the AFM layer has a thickness in the range of 50–100 Å.

11. The magnetic read/write head as recited in claim 8, wherein in the absence of positive and negative magnetic incursions the magnetization of said AP-pinned layer is pinned in a direction substantially perpendicular to the direction of magnetization of said free layer.

12. A magnetic read/write head comprising:
a write head including:
at least one coil layer and an insulation stack, the coil layer being embedded in the insulation stack; first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;
a read head including:
a spin valve (SV) sensor, first and second gap layers, and first and second shield layers, the SV sensor being sandwiched between the first and second gap layers and the first and second gap layers being sandwiched between the first and second shield layers; the SV sensor having positive and negative readback signals about a bias point of a transfer curve upon sensing positive and negative magnetic incursions from a moving magnetic medium, said SV sensor comprising:
a ferromagnetic free layer having a magnetization that is free to rotate in first and second directions from a position which corresponds to said bias point upon sensing positive and negative magnetic incursions, respectively;
an antiparallel (AP)-pinned layer having a magnetization that is pinned in a pinned direction, said AP-pinned layer including:
a first ferromagnetic (FM1) pinned layer;
a second ferromagnetic (FM2) pinned layer having a thickness greater than said FM1 layer; and
an antiparallel coupling (APC) layer disposed between the FM1 layer and the FM2 layer;
an antiferromagnetic (AFM) layer immediately adjacent said FM1 layer which pins the magnetization of the AP-pinned layer along said pinned direction;
a nonmagnetic electrically conductive spacer layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the SV sensor to a sense current;
a nonmagnetic electrically conductive spin-filter layer adjacent to the free layer;

a current source connected to the SV sensor for applying said sense current, said sense current having a direction of flow that upon applying said sense current, a net sense current field ($H_{SC}$) due to fields from electrically conductive layers of the SV sensor has a direction and magnitude that assists the AFM layer in pinning the AP-pinned layer in said pinned direction;

the direction of the magnetization of the free layer being influenced by a ferromagnetic coupling field ($H_{FC}$) from the FM2 layer, a demagnetization field ($H_{demag}$) from the AP-pinned layer, a net image field ($H_{image}$) and the net sense current field ($H_{SC}$); and the direction of magnetization of the AP-pinned layer being pinned in a canted direction of such magnitude and direction that the net influence of $H_{FC}$, $H_{demag}$, $H_{image}$ and $H_{SC}$ on the free layer rotates the direction of magnetization of the free layer to a direction substantially perpendicular to the canted direction of magnetization of the AP-pinned layer; and an insulation layer disposed between the second shield layer of the read head and the first pole piece layer of the write head.

13. The magnetic read/write head as recited in claim 12, wherein the AFM layer is made of Pt—Mn.

14. The magnetic read/write head as recited in claim 13, wherein the AFM layer has a thickness in the range of 50–100 Å.

15. A disk drive system comprising:
a magnetic recording disk;
a magnetic read/write head for magnetically recording data on the magnetic recording disk and for sensing magnetically recorded data on the magnetic recording disk, said magnetic read/write head comprising:
a write head including:
at least one coil layer and an insulation stack, the coil layer being embedded in the insulation stack;
first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;
a read head including:
a spin valve (SV) sensor, first and second gap layers, and first and second shield layers, the SV sensor being sandwiched between the first and second gap layers and the first and second gap layers being sandwiched between the first and second shield layers;
the SV sensor having positive and negative readback signals about a bias point of a transfer curve upon sensing positive and negative magnetic incursions from a moving magnetic medium, said SV sensor comprising:
a ferromagnetic free layer having a magnetization that is free to rotate in first and second directions from a position which corresponds to said bias point upon sensing positive and negative magnetic incursions, respectively;
an antiparallel (AP)-pinned layer having a magnetization that is pinned in a pinned direction, said AP-pinned layer including:
a first ferromagnetic (FM1) pinned layer;
a second ferromagnetic (FM2) pinned layer having a thickness greater than said FM1 layer; and an antiparallel coupling (APC) layer disposed between the FM1 layer and the FM2 layer;

an antiferromagnetic (AFM) layer immediately adjacent said FM1 layer which pins the magnetization of the AP-pinned layer along said pinned direction;

a nonmagnetic electrically conductive spacer layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the SV sensor to a sense current;

a nonmagnetic electrically conductive spin-filter layer adjacent to the free layer;

a current source connected to the SV sensor for applying said sense current, said sense current having a direction of flow that upon applying said sense current a net sense current field ($H_{SC}$) due to fields from electrically conductive layers of the SV sensor has a direction and magnitude that assists the AFM layer in pinning the AP-pinned layer in said pinned direction;

the direction of the magnetization of the free layer being influenced by a ferromagnetic coupling field ($H_{FC}$) from the FM2 layer, a demagnetization field ($H_{demag}$) from the AP-pinned layer, a net image field ($H_{image}$) and the net sense current field ($H_{SC}$); and said sense current having a predetermined direction and of such magnitude and direction that a net influence of $H_{FC}$, $H_{demag}$, $H_{image}$ and $H_{SC}$ on the free layer is substantially zero;

an insulation layer disposed between the second shield layer of the read head and the first pole piece layer of the write head;

an actuator for moving said magnetic read/write head across the magnetic disk so that the read/write head may access different regions of the magnetic recording disk; and a recording channel coupled electrically to the write head for magnetically recording data on the magnetic recording disk and to the SV sensor of the read head for detecting changes in resistance of the SV sensor caused by rotation of the magnetization axis of the free ferromagnetic layer relative to the fixed magnetization of the AP-pinned layer in response to magnetic fields from the magnetically recorded data.

16. The disk drive system as recited in claim 15, wherein the AFM layer is made of Pt—Mn.

17. The disk drive system as recited in claim 16, wherein the AFM layer has a thickness in the range of 50–100 Å.

18. The disk drive system as recited in claim 15, wherein in the absence of positive and negative magnetic incursions the magnetization of said AP-pinned layer is pinned in a direction substantially perpendicular to the direction of magnetization of said free layer.

19. A disk drive system comprising:

a magnetic recording disk;

a magnetic read/write head for magnetically recording data on the magnetic recording disk and for sensing magnetically recorded data on the magnetic recording disk, said magnetic read/write head comprising:

a write head including:

at least one coil layer and an insulation stack, the coil layer being embedded in the insulation stack;

first and second pole piece layers connected at a back gap and having pole tips with edges forming a portion of an air bearing surface (ABS);

the insulation stack being sandwiched between the first and second pole piece layers; and a write gap layer sandwiched between the pole tips of the first and second pole piece layers and forming a portion of the ABS;

a read head including:

a spin valve (SV) sensor, first and second gap layers, and first and second shield layers, the SV sensor being sandwiched between the first and second gap layers and the first and second gap layers being sandwiched between the first and second shield layers; the SV sensor having positive and negative readback signals about a bias point of a transfer curve upon sensing positive and negative magnetic incursions from a moving magnetic medium, said SV sensor comprising:

a ferromagnetic free layer having a magnetization that is free to rotate in first and second directions from a position which corresponds to said bias point upon sensing positive and negative magnetic incursions, respectively;

an antiparallel (AP)-pinned layer having a magnetization that is pinned in a pinned direction, said AP-pinned layer including:

a first ferromagnetic (FM1) pinned layer;

a second ferromagnetic (FM2) pinned layer having a thickness greater than said FM1 layer; and an antiparallel coupling (APC) layer disposed between the FM1 layer and the FM2 layer;

an antiferromagnetic (AFM) layer immediately adjacent said FM1 layer which pins the magnetization of the AP-pinned layer along said pinned direction;

a nonmagnetic electrically conductive spacer layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the SV sensor to a sense current;

a nonmagnetic electrically conductive spin-filter layer adjacent to the free layer;

a current source connected to the SV sensor for applying said sense current, said sense current having a direction of flow that upon applying said sense current, a net sense current field ($H_{SC}$) due to fields from electrically conductive layers of the SV sensor has a direction and magnitude that assists the AFM layer in pinning the AP-pinned layer in said pinned direction;

the direction of the magnetization of the free layer being influenced by a ferromagnetic coupling field ($H_{FC}$) from the FM2 layer, a demagnetization field ($H_{demag}$) from the AP-pinned layer, a net image field ($H_{image}$) and the net sense current field ($H_{SC}$); and the direction of magnetization of the AP-pinned layer being pinned in a canted direction of such magnitude and K direction that the net influence of $H_{FC}$, $H_{demag}$, $H_{image}$ and $H_{SC}$ on the free layer rotates the direction of magnetization of the free layer to a direction substantially perpendicular to the canted direction of magnetization of the AP-pinned layer;

an insulation layer disposed between the second shield layer of the read head and the first pole piece layer of the write head;

an actuator for moving said magnetic read/write head across the magnetic disk so that the read/write head may access different regions of the magnetic recording disk; and a recording channel coupled electrically to the write head for magnetically recording data on the magnetic recording disk and to the SV sensor of the read head for detecting changes in resistance of the SV sensor caused by rotation of the magnetization axis of the free ferromagnetic layer relative to the fixed magnetization of the AP-pinned layer in response to magnetic fields from the magnetically recorded data.

20. The disk drive system as recited in claim 19, wherein the AFM layer is made of Pt—Mn.

21. The disk drive system as recited in claim 20, wherein the AFM layer has a thickness in the range of 50–100 Å.

* * * * *